(12) United States Patent
Tang

(10) Patent No.: US 8,980,699 B2
(45) Date of Patent: Mar. 17, 2015

(54) THYRISTOR-BASED MEMORY CELLS, DEVICES AND SYSTEMS INCLUDING THE SAME AND METHODS FOR FORMING THE SAME

(71) Applicant: Micron Technology, Inc., Boise, ID (US)

(72) Inventor: Sanh D. Tang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/965,463

(22) Filed: Aug. 13, 2013

(65) Prior Publication Data

US 2013/0323887 A1 Dec. 5, 2013

Related U.S. Application Data

(60) Continuation of application No. 13/610,034, filed on Sep. 11, 2012, now Pat. No. 8,524,543, which is a division of application No. 12/715,889, filed on Mar. 2, 2010, now Pat. No. 8,288,795.

(51) Int. Cl.
*H01L 21/332* (2006.01)
*H01L 29/66* (2006.01)
*H01L 27/102* (2006.01)
(Continued)

(52) U.S. Cl.
CPC ...... *H01L 29/66363* (2013.01); *H01L 27/1027* (2013.01); *H01L 29/749* (2013.01); *H01L 29/401* (2013.01)
USPC 438/133; 438/135; 257/E21.35; 257/E21.388

(58) Field of Classification Search
USPC ............ 438/133, 135, 137, 138; 257/E21.35, 257/E21.388
See application file for complete search history.

(56) References Cited

U.S. PATENT DOCUMENTS

| 3,988,771 A | 10/1976 | Krishna |
| 5,102,821 A | 4/1992 | Moslehi |

(Continued)

FOREIGN PATENT DOCUMENTS

| CN | 20118001628.6 | 6/2014 |
| CN | 201180011630.3 | 7/2014 |

(Continued)

OTHER PUBLICATIONS

U.S. Appl. No. 12/410,207, filed Mar. 24, 2009, Tang et al.
(Continued)

*Primary Examiner* — Hoai V Pham
(74) *Attorney, Agent, or Firm* — Wells St. John, P.S.

(57) ABSTRACT

Semiconductor devices including a plurality of thyristor-based memory cells, each having a cell size of $4F^2$, and methods for forming the same are provided. The thyristor-based memory cells each include a thyristor having vertically superposed regions of alternating dopant types, and a control gate. The control gate may be electrically coupled with one or more of the thyristors and may be operably coupled to a voltage source. The thyristor-based memory cells may be formed in an array on a conductive strap, which may function as a cathode or a data line. A system may be formed by integrating the semiconductor devices with one or more memory access devices or conventional logic devices, such as a complementary metal-oxide-semiconductor (CMOS) device.

15 Claims, 10 Drawing Sheets

(51) Int. Cl.
*H01L 29/749* (2006.01)
*H01L 29/40* (2006.01)

(56) References Cited

U.S. PATENT DOCUMENTS

| | | | |
|---|---|---|---|
| 5,106,776 A | 4/1992 | Shen et al. |
| 5,260,233 A | 11/1993 | Buti et al. |
| 5,412,598 A | 5/1995 | Shulman |
| 5,465,249 A | 11/1995 | Cooper, Jr. et al. |
| 5,510,630 A | 4/1996 | Agarwal et al. |
| 5,563,084 A | 10/1996 | Ramm et al. |
| 5,600,160 A | 2/1997 | Hvistendahl |
| 5,904,507 A | 5/1999 | Thomas |
| 5,909,618 A | 6/1999 | Forbes et al. |
| 5,936,274 A | 8/1999 | Forbes et al. |
| 5,963,469 A | 10/1999 | Forbes |
| 6,017,778 A | 1/2000 | Pezzani |
| 6,033,957 A | 3/2000 | Burns, Jr. et al. |
| 6,137,128 A | 10/2000 | Holmes et al. |
| 6,191,476 B1 | 2/2001 | Takahashi et al. |
| 6,225,151 B1 | 5/2001 | Gardner et al. |
| 6,225,165 B1 | 5/2001 | Noble, Jr. et al. |
| 6,229,161 B1 | 5/2001 | Nemati et al. |
| 6,255,731 B1 | 7/2001 | Ohmi et al. |
| 6,294,418 B1 | 9/2001 | Noble |
| 6,303,468 B1 | 10/2001 | Aspar et al. |
| 6,335,231 B1 | 1/2002 | Yamazaki et al. |
| 6,335,258 B1 | 1/2002 | Aspar et al. |
| 6,352,894 B1 | 3/2002 | Goebel et al. |
| 6,355,501 B1 | 3/2002 | Fung et al. |
| 6,355,520 B1 | 3/2002 | Park et al. |
| 6,365,488 B1 | 4/2002 | Liao |
| 6,492,662 B2 | 12/2002 | Hsu et al. |
| 6,559,471 B2 | 5/2003 | Finder et al. |
| 6,593,624 B2 | 7/2003 | Walker |
| 6,600,173 B2 | 7/2003 | Tiwari |
| 6,627,924 B2 | 9/2003 | Hsu et al. |
| 6,690,039 B1 | 2/2004 | Nemati et al. |
| 6,713,791 B2 | 3/2004 | Hsu et al. |
| 6,744,094 B2 | 6/2004 | Forbes |
| 6,756,266 B2 | 6/2004 | Moriceau et al. |
| 6,809,044 B1 | 10/2004 | Aspar et al. |
| 6,812,504 B2 | 11/2004 | Bhattacharyya |
| 6,815,781 B2 | 11/2004 | Vyvoda et al. |
| 6,841,813 B2 | 1/2005 | Walker et al. |
| 6,870,202 B2 | 3/2005 | Oka |
| 6,881,994 B2 | 4/2005 | Lee et al. |
| 6,882,008 B1 | 4/2005 | Ohsawa |
| 6,888,199 B2 | 5/2005 | Nowak et al. |
| 6,891,205 B1 | 5/2005 | Cho et al. |
| 6,906,354 B2 | 6/2005 | Hsu et al. |
| 6,934,209 B2 | 8/2005 | Marr |
| 6,940,748 B2 | 9/2005 | Nejad et al. |
| 6,940,761 B2 | 9/2005 | Forbes |
| 6,946,365 B2 | 9/2005 | Aspar et al. |
| 6,953,953 B1 | 10/2005 | Horch |
| 6,965,129 B1 | 11/2005 | Horch et al. |
| 6,992,349 B2 | 1/2006 | Lee et al. |
| 6,995,456 B2 | 2/2006 | Nowak |
| 7,029,956 B2 | 4/2006 | Hsu et al. |
| 7,052,941 B2 | 5/2006 | Lee |
| 7,075,146 B2 | 7/2006 | Forbes |
| 7,081,663 B2 | 7/2006 | Bulucea |
| 7,115,939 B2 | 10/2006 | Forbes |
| 7,120,046 B1 | 10/2006 | Forbes |
| 7,129,538 B2 | 10/2006 | Lee et al. |
| 7,151,024 B1 | 12/2006 | Forbes |
| 7,157,771 B2 | 1/2007 | Forbes |
| RE39,484 E | 2/2007 | Bruel |
| 7,180,135 B1 | 2/2007 | Ioannou |
| 7,195,959 B1 | 3/2007 | Plummer et al. |
| 7,250,646 B2 | 7/2007 | Walker et al. |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,304,327 B1 | 12/2007 | Nemati et al. |
| 7,323,380 B2 | 1/2008 | Forbes |
| 7,326,969 B1 | 2/2008 | Horch |
| 7,338,862 B2 | 3/2008 | Huo et al. |
| 7,358,120 B2 | 4/2008 | Furukawa et al. |
| 7,359,229 B2 | 4/2008 | Ferrant et al. |
| 7,362,609 B2 | 4/2008 | Harrison et al. |
| 7,368,352 B2 | 5/2008 | Kim et al. |
| 7,378,325 B2 | 5/2008 | Kaneko |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,525,137 B2 | 4/2009 | Walker et al. |
| 7,538,000 B2 | 5/2009 | Dao |
| 7,579,240 B2 | 8/2009 | Forbes |
| 7,589,995 B2 | 9/2009 | Tang et al. |
| 7,592,209 B2 | 9/2009 | Chang |
| 7,615,436 B2 | 11/2009 | Kouznetsov et al. |
| 7,619,917 B2 | 11/2009 | Nirschl et al. |
| 7,629,651 B2 | 12/2009 | Nakajima |
| 7,663,188 B2 | 2/2010 | Chung |
| 7,786,505 B1 | 8/2010 | Yang et al. |
| 7,825,455 B2 | 11/2010 | Lee et al. |
| 7,838,360 B2 | 11/2010 | Forbes |
| 7,897,440 B1 | 3/2011 | Horch |
| 7,929,343 B2 | 4/2011 | Tang |
| 8,018,058 B2 | 9/2011 | Lee |
| 8,084,316 B2 | 12/2011 | Huo et al. |
| 8,102,025 B2 | 1/2012 | Ozeki et al. |
| 8,148,780 B2 | 4/2012 | Tang et al. |
| 8,501,559 B2 | 8/2013 | Tang et al. |
| 8,501,581 B2 | 8/2013 | Tang et al. |
| 8,558,220 B2 | 10/2013 | Schricker et al. |
| 2001/0002062 A1 | 5/2001 | Noble, Jr. et al. |
| 2001/0024841 A1 | 9/2001 | Manning |
| 2002/0070454 A1 | 6/2002 | Yasukawa |
| 2002/0158254 A1 | 10/2002 | Hsu et al. |
| 2002/0163019 A1 | 11/2002 | Mohsen |
| 2003/0223292 A1 | 12/2003 | Nejad et al. |
| 2004/0159853 A1 | 8/2004 | Nemati et al. |
| 2004/0214379 A1 | 10/2004 | Lee et al. |
| 2004/0262635 A1* | 12/2004 | Lee ............................. 257/199 |
| 2005/0001232 A1 | 1/2005 | Bhattacharyya |
| 2005/0230356 A1 | 10/2005 | Empedocles et al. |
| 2006/0034116 A1 | 2/2006 | Lam et al. |
| 2006/0071074 A1 | 4/2006 | Konececki et al. |
| 2006/0099776 A1 | 5/2006 | Dupont |
| 2006/0124974 A1 | 6/2006 | Cabral et al. |
| 2006/0125011 A1 | 6/2006 | Chang |
| 2006/0197115 A1 | 9/2006 | Toda |
| 2006/0227601 A1 | 10/2006 | Bhattacharyya |
| 2007/0012945 A1 | 1/2007 | Sugizaki |
| 2007/0023805 A1 | 2/2007 | Wells et al. |
| 2007/0029607 A1 | 2/2007 | Kouznetzov |
| 2007/0045709 A1 | 3/2007 | Yang |
| 2007/0080385 A1 | 4/2007 | Kim et al. |
| 2007/0127289 A1 | 6/2007 | Lee |
| 2007/0215954 A1 | 9/2007 | Mouli |
| 2007/0252175 A1 | 11/2007 | Tang et al. |
| 2007/0264771 A1 | 11/2007 | Ananthan et al. |
| 2008/0124867 A1 | 5/2008 | Brown |
| 2008/0128802 A1 | 6/2008 | Huo et al. |
| 2008/0211023 A1 | 9/2008 | Shino |
| 2008/0233694 A1 | 9/2008 | Li |
| 2008/0237776 A1 | 10/2008 | Abbott |
| 2008/0299753 A1 | 12/2008 | Figura et al. |
| 2009/0003025 A1 | 1/2009 | Makhlesi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0072341 A1 | 3/2009 | Liu et al. |
| 2009/0079030 A1 | 3/2009 | Cheng et al. |
| 2009/0108351 A1 | 4/2009 | Yang et al. |

(56) References Cited

U.S. PATENT DOCUMENTS

| | | |
|---|---|---|
| 2009/0140290 A1 | 6/2009 | Schulze et al. |
| 2009/0170261 A1 | 7/2009 | Lee |
| 2009/0173984 A1 | 7/2009 | Wang |
| 2009/0189228 A1 | 7/2009 | Zhang et al. |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |
| 2009/0218656 A1 | 9/2009 | Gonzalez et al. |
| 2009/0242865 A1 | 10/2009 | Lung et al. |
| 2010/0006938 A1 | 1/2010 | Jang |
| 2010/0008139 A1 | 1/2010 | Bae |
| 2010/0061145 A1 | 3/2010 | Weis |
| 2010/0200916 A1 | 8/2010 | Gossner et al. |
| 2010/0207180 A1 | 8/2010 | Lee |
| 2010/0277982 A1 | 11/2010 | Okhonin |
| 2011/0024791 A1 | 2/2011 | Schulze et al. |
| 2011/0156044 A1 | 6/2011 | Lee et al. |
| 2011/0215371 A1 | 9/2011 | Tang et al. |
| 2011/0215407 A1 | 9/2011 | Tang et al. |
| 2011/0215408 A1 | 9/2011 | Tang et al. |
| 2011/0215436 A1 | 9/2011 | Tang et al. |
| 2012/0223369 A1 | 9/2012 | Gupta et al. |
| 2012/0223380 A1 | 9/2012 | Lee et al. |

FOREIGN PATENT DOCUMENTS

| | | |
|---|---|---|
| JP | H02-275663 | 11/1990 |
| JP | H04-64249 | 2/1992 |
| JP | H04-186815 | 7/1992 |
| JP | H04-283914 | 10/1992 |
| JP | 06-104446 | 4/1994 |
| JP | H08-088153 | 4/1996 |
| JP | H10-150176 | 6/1998 |
| JP | H11-103035 | 4/1999 |
| JP | 2000-150905 | 5/2000 |
| JP | 2003-030980 | 1/2003 |
| JP | 2004-03398 | 10/2004 |
| JP | 2005-136191 | 5/2005 |
| JP | 2005-327766 | 11/2005 |
| JP | 2008-010503 | 1/2006 |
| JP | 2007-511895 | 5/2007 |
| JP | 2009-531860 | 9/2009 |
| JP | 2011-508979 | 3/2011 |
| KR | 10-0663359 | 10/2006 |
| KR | 10-0702014 | 11/2006 |
| KR | 10-0821456 | 4/2008 |
| KR | 2009-0040460 | 4/2009 |
| KR | 2009-0054245 | 5/2009 |
| KR | 10-2010-0070685 | 6/2010 |
| TW | 200802866 | 1/2008 |
| TW | 101104088 | 12/2013 |
| TW | 100106777 | 2/2014 |
| TW | 100106775 | 6/2014 |
| TW | 101107759 | 6/2014 |
| WO | WO 2009/088889 | 7/2009 |
| WO | PCT/US2011/024354 | 9/2011 |
| WO | PCT/US2011/024376 | 9/2011 |
| WO | PCT/US2011/024387 | 9/2011 |
| WO | PCT/2012/021438 | 8/2012 |
| WO | PCT/US2011/024354 | 9/2012 |
| WO | PCT/US2011/024376 | 9/2012 |
| WO | PCT/US2011/024387 | 9/2012 |
| WO | PCT/US2012/025109 | 9/2012 |
| WO | PCT/US2012/025115 | 10/2012 |
| WO | PCT/US2012/021438 | 8/2013 |
| WO | PCT/US2012/025109 | 9/2013 |
| WO | PCT/US2012/025115 | 9/2013 |

OTHER PUBLICATIONS

U.S. Appl. No. 12/419,858, filed Apr. 7, 2009, Tang et al.
U.S. Appl. No. 12/715,704, filed Apr. 14, 2011, Tang et al.
U.S. Appl. No. 12/715,743, filed Mar. 2, 2010, Tang et al.
U.S. Appl. No. 12/715,843, filed Mar. 2, 2010, Tang et al.
U.S. Appl. No. 12/715,889, filed Mar. 2, 2010, Tang et al.
U.S. Appl. No. 12/715,922, filed Mar. 2, 2010, Tang et al.
Cho et al., A Novel Capacitator-Less DRAM Cell Using Thin Capacitively-Coupled Thyristor (TCCT), IEEE, 2005, 4 pages.
Nemati et al., A Novel High Density, Low Voltage SRAM Cell with a Verfical NDR Device, IEEE, 1998,2 pages.
Sasago et al., "Cross-point phase change memory with 4F2 cell size driven by low-contact-resistivity poly-Si diode", Symposium on VLSI Technology Digest of Technical Papers, 2009, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", Symposium on VLSI Technology Digest of Technical Papers, 2008.
Suliman et al., Gate-Oxide Grown on the Sidewalls and Base of aU-Shaped Si Trench: Effects of the Oxide and Oxide/Si Interface Condition on the Properties of Vertical MOS Devices, Microelectronic Engineering, vol. 72, pp. 247-252; 2004.
Yang et al., High Performance CMOS Fabricated on Hybrid Substrate with Different Crystal Orientations, IEEE, 2003, 4 pages.
Yu et al., Low-Temperature Titanium-Based Wafer Bonding, Journal of the Electrocheical Society, vol.154, No. 1, 2007, pp. H20-H25.
Cheong et al., "Investigation of Ultralow Leakage in MOS Capacitors on4H SiC", IEEE Transactions on Electron Devices, vol. 51(9), Sep. 2004, pp. 1361-1365.
Dimitraiadis et al., "New a-SiC, Optically Controlled, Thyristor-Like Switch", Electronics Letters, vol. 28)17), Aug. 13, 1992, pp. 1622-1624.
Jen et al., "Electrical and Luminescent Characteristics of a-SiC:H P-I-:" Thin-Film LED's with Graded-Gap Junctions, IEEE Transactions on Electron Devices, vol. 44(4), Apr. 1997, pp. 565-571.
Powell et al., "SiC Materials-Progess, Status, and Potential Roadblocks", Proceedings of the IEEE, vol. 90(6), Jun. 2002, pp. 942-955.
Xie et al., "A Veritically Integrated Bipolar Storage Cell in 6H Silicon Carbide for Nonvolatile Memory Applications", IEEE Electron Device Letters, vol. 15(6), Jun. 1994, pp. 212-214.
Burke et al., "Silicon Carbide Thyristors for Power Applications", Pulsed Power Conference 1995, Digest of Technical Papers, 10th IEEE International vol. 1, United States; Jul. 3-6, 1995; pp. 327-335.

* cited by examiner

US 8,980,699 B2

THYRISTOR-BASED MEMORY CELLS, DEVICES AND SYSTEMS INCLUDING THE SAME AND METHODS FOR FORMING THE SAME

CROSS-REFERENCE TO RELATED APPLICATIONS

This patent resulted from a continuation of U.S. patent application Ser. No. 13/610,034 filed Sep. 11, 2012, entitled "Thyristor-Based Memory Cells, Devices and Systems Including the Same and Methods for Forming the Same", naming Sanh D. Tang as inventor, which is a divisional application of U.S. patent application Ser. No. 12/715,889, filed Mar. 2, 2012, now U.S. Pat. No. 8,288,795 which issued Oct. 16, 2012, entitled "Thyristor-Based Memory Cells, Devices and Systems Including the Same and Methods for Forming the Same", naming Sanh D. Tang as inventor, which is related to co-pending U.S. patent application Ser. No. 12/715,704 filed on Mar. 2, 2010, and titled "SEMICONDUCTOR-METAL-ON-INSULATOR STRUCTURES, METHODS OF FORMING SUCH STRUCTURES, AND SEMICONDUCTOR DEVICES INCLUDING SUCH STRUCTURES"; co-pending U.S. patent application Ser. No. 12/715,843 filed on Mar. 2, 2010, and titled "FLOATING BODY CELL STRUCTURES, DEVICES INCLUDING SAME, AND METHODS FOR FORMING SAME"; co-pending U.S. patent application Ser. No. 12/715,743 filed on Mar. 2, 2010, and titled "SEMICONDUCTOR DEVICES INCLUDING A DIODE STRUCTURE OVER A CONDUCTIVE STRAP, AND METHODS OF FORMING SUCH SEMICONDUCTOR DEVICES"; and co-pending U.S. patent application Ser. No. 12/715,922 filed on Mar. 2, 2010, and titled "SEMICONDUCTOR CELLS, ARRAYS, DEVICES AND SYSTEMS HAVING A BURIED CONDUCTIVE LINE AND METHODS FOR FORMING THE SAME", the disclosures of which are incorporated herein by reference.

TECHNICAL FIELD

Embodiments of the present invention relate to thyristor-based memory cells, semiconductor devices that include one or more thyristors and methods for forming such memory cells and semiconductor devices.

BACKGROUND

Integrated circuit (IC) memory devices conventionally include static random access memory (SRAM). Conventional SRAM is based on four-transistor memory cells (4T SRAM cells) or six-transistor memory cells (6T SRAM cells) that are compatible with conventional memory elements, such as complementary metal-oxide-semiconductor (CMOS) devices, operate at low voltage levels and perform at relatively high speeds. However, conventional SRAM consumes a large cell area that limits high-density design of SRAM.

In attempts to reduce the area of IC memory devices, high-density, low-voltage SRAM cells including four layers of alternating n- and p-type silicon material, often referred to as a "thin capacitively-coupled thyristor (TCCT)" have been fabricated. As used herein, the term "thyristor," means and includes a bi-stable, three-terminal device that includes a four layer structure including a p-type anode region, an n-type base, a p-type base, and an n-type cathode region arranged in a p-n-p-n configuration. The thyristor may include two main terminals, an anode and a cathode, and the control terminal, often referred to as the "gate," which may be attached to the p-type material nearest the cathode. Thyristor-based random access memory (T-RAM) cells demonstrate faster switching speeds and lower operating voltages in comparison to conventional SRAM cells.

A thyristor in a memory device may be turned on by biasing the gate so that a p-n-p-n channel conducts a current. Once the device is turned on, often referred to as "latched," the thyristor does not require the gate to be biased to maintain the current conducted between the cathode and the anode. Instead, it will continue to conduct until a minimum holding current is no longer maintained between the anode and cathode, or until the voltage between the anode and the cathode is reversed. Accordingly, the thyristor may function as a switch or diode capable of being switched between an "on" state and an "off" state.

Referring to FIG. 1A, a conventional T-RAM cell 10 includes a vertical Referring to FIG. 1 FIG. 1A, a conventional T-RAM cell 10 includes a vertical thyristor 12 with a vertical surrounding gate 14 as a bi-stable element and an access transistor 16 formed on a silicon substrate 11. The thyristor 12 includes an anode region 18, an n base region 20, a p base region 22 and a cathode region 24. The T-RAM cell 10 is accessed by two word lines, a first word line 26 used to control an access gate of the access transistor 16 and the gate 14, which functions as the second word line during write operations, and is used to control switching of the vertical thyristor 12. The vertical thyristor 12 is connected to a reference voltage 28. The gate 14 may improve the switching speed of the vertical thyristor 12. A bit line 30 connects the T-RAM cell 10 to a sense amplifier (not shown) for reading and writing data from and to the T-RAM cell 10. The T-RAM cell 10 exhibits a very low standby current in the range of 10 pA.

However, there are several drawbacks associated with the T-RAM cell 10, including limitations on scalability, control and integration. For example, the T-RAM cells 10 are limited by difficulties in controlling the dimensions of each thyristor 12 as well as reproducing the dimensions for each thyristor 12 in an array. Due to difficulties in scaling the vertical thyristor 12 and the gate 14, the T-RAM cells 10 are difficult to scale to areas of less than $8F^2$, where F is the minimal feature size. Moreover, forming the doped regions of the thyristor 12 is hindered by implanting processes, which may lead to undesirable dopant concentrations or distributions in the thyristor 12. In addition, T-RAM cells 10 must be fabricated separate from any other devices, such as logic devices, which require extra fabrication acts. Finally, connection of the T-RAM cells 10 by means of the word line 26 and the gate 14 may lead to serial (i.e., cell-to-cell) resistance and device failure.

Accordingly, what is needed in the art are thyristor-based memory cells for forming devices having improved scalability, density and integration capacity and methods for forming the same.

DETAILED DESCRIPTION

Figure 1A:
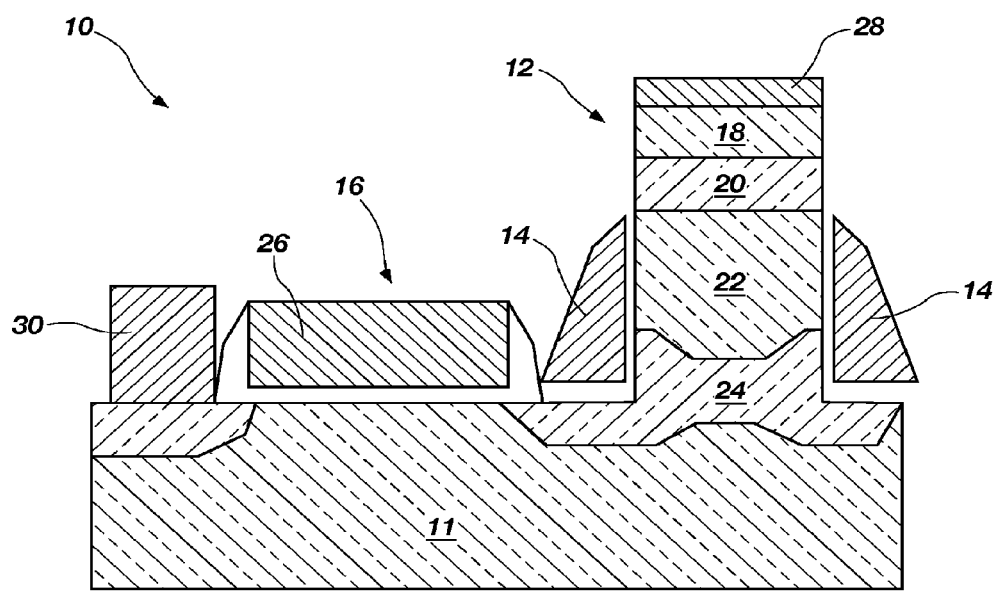
FIG. 1A illustrates a cross-sectional view of a T-RAM cell in accordance with the prior art.

Memory cells, a semiconductor device including such memory cells and methods for forming such memory cells and devices are disclosed. Such memory cells include, for example, at least one thyristor including vertically superposed, alternating doped regions disposed on a conductive strap and a control gate associated with the thyristor. As used herein, the term "vertically superposed" means and includes a material(s) disposed atop or situated one upon another in such a manner that perimeters or outer surfaces thereof generally coincide. The conductive strap may provide an electrical connection for the thyristor. The memory cells may have a cell size of $4F^2$, wherein F is a minimum feature size, to provide semiconductor devices having improved scalability, reduced area and increased memory cell density. The memory cells and devices formed in accordance with various embodiments of the present invention may be integrated with one or more logic devices, such as a CMOS device, and may be used in a system, such as, for example, a central processing unit (CPU), a system-on-a-chip (SOC), sensors, imagers, micro electro-mechanical systems (MEMS) and nano electro-mechanical systems (NEMS). Methods of forming such memory cells and devices are provided. The methods may include a material transfer process that enables controlled formation of the doped regions and simplified integration of the memory cells and devices.

The following description provides specific details, such as material types and processing conditions, in order to provide a thorough description of embodiments of the present invention and implementation thereof. However, a person of ordinary skill in the art will understand that the embodiments of the present invention may be practiced without employing these specific details and in conjunction with conventional fabrication techniques. In addition, the description provided herein does not form a complete process flow for manufacturing a semiconductor device or system. Only those process acts and structures necessary to understand the embodiments of the present invention are described in detail herein. Additional acts to form a complete system or integrated circuit device including the memory device according to an embodiment of the present invention may be performed by conventional techniques.

The materials described herein may be formed by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Alternatively, materials may be grown in situ. A technique suitable for depositing or growing a particular material may be selected by a person of ordinary skill in the art. While the materials described and illustrated herein may be formed as layers, the materials are not limited thereto and may be formed in other three-dimensional configurations.

The terms "horizontal" and "vertical," as used herein, define relative positions of elements or structures with respect to a major plane or surface of a wafer or substrate, regardless of the orientation of the wafer or substrate, and are orthogonal dimensions interpreted with respect to the orientation of the structure being described, as illustrated in the drawing being referred to. As used herein, the term "vertical" means and includes a dimension substantially perpendicular to the major surface of a substrate or wafer as illustrated, and the term "horizontal" means a dimension substantially parallel to the major surface of the substrate or wafer as illustrated and extending between left and right sides of the drawing. Prepositions such as "on," "over," "above" and "under," as used herein, are relative terms corresponding to the vertical direction with respect to the structure being described.

In the following detailed description, reference is made to the accompanying drawings, which form a part hereof, and in which is shown, by way of illustration, specific embodiments in which the present invention may be practiced. These embodiments are described in sufficient detail to enable a person of ordinary skill in the art to practice the present invention. However, other embodiments may be utilized, and structural, logical, and electrical changes may be made without departing from the scope of the invention. The illustrations presented herein are not meant to be actual views of any particular system, logic device, semiconductor device or memory cell, but are merely idealized representations which are employed to describe the embodiments of the present invention. The drawings presented herein are not necessarily drawn to scale. Additionally, elements common between drawings may retain the same numerical designation.

Figure 2A:
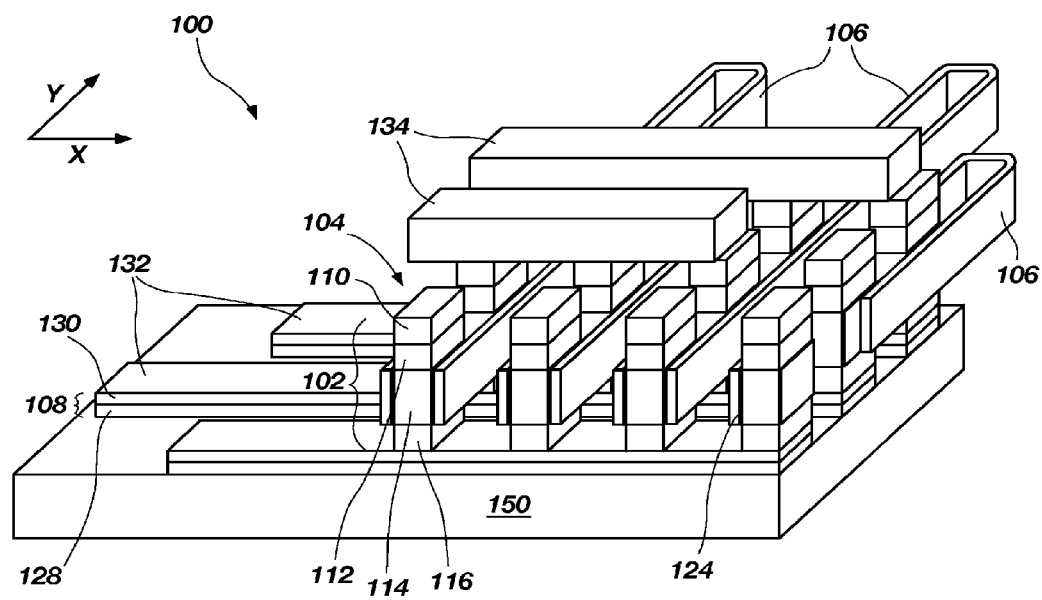
FIG. 2A illustrates a perspective view of a portion of a semiconductor device in accordance with an embodiment of the present invention.

FIG. 2A is an illustration of a semiconductor device 100 that includes a plurality of memory cells 102, each including a thyristor 104 and an associated control gate 106. The plurality of memory cells 102 of the semiconductor device 100 may be disposed on a conductive strap 108 overlying an electrically insulative material 150, which may also be characterized as a dielectric material. For simplicity, the electrically insulative material 150 is hereinafter referred to as insulative material 150. Each of the thyristors 104 may have a general shape of a column or pillar and may include a semiconductor material, such as a crystalline silicon material, a silicon germanium ($Si_{1-x}Ge_x$) material, a gallium arsenide (GaAs) material or a gallium nitride (GaN) material. The thyristors 104 may each include a plurality of vertically superposed, alternately doped regions, such as cathode region 116, p base region 114, n base region 112 and anode region 110. As used herein, the terms "alternately doped regions" and "alternately doped semiconductor regions" mean and include portions of oppositely doped semiconductor material disposed in succession, one after the other. The anode region 110 may include a highly doped p-type silicon material (i.e., a p+ material). The n base region 112 may comprise an n-type silicon material. The p base region 114 may include a p-type silicon material. The cathode region 116 may include a highly doped semiconductor material (i.e., an n+ material), such as a highly doped silicon germanium material, a highly doped gallium arsenide material or a highly doped gallium nitride material. As used herein, the term "highly doped," as used herein, means and includes a material having a higher concentration of a dopant than those which are not highly doped. Accordingly, the anode region 110 and the cathode region 116 may, respectively, have an increased dopant concentration in comparison to the p base region 114 and the n base region 112. The thyristors 104 have a substantially reduced area in comparison to conventional horizontally aligned thyristors. Accordingly, a footprint of the semiconductor device 100 may be substantially reduced in comparison to conventional T-RAM cells.

As a non-limiting example, the memory cells 102 may be arranged in an array that includes a plurality of rows extending in a first direction X and a plurality of columns extending in a second direction Y. The semiconductor device 100 shown in FIG. 2A includes three (3) rows and four (4) columns of thyristors 104. However, in actuality and as configured, the semiconductor device 100 may include any number of rows and columns. Additionally, the rows of thyristors 104 aligned in the first direction X may be substantially perpendicular to the columns of thyristors 104 aligned in the second direction Y. The semiconductor device 100 may be disposed on the insulative material 150 overlying a wafer (not shown), which may include a conventional logic device, as will be described in detail.

The control gates 106 (i.e., access line) may each include a conductive material and may be each be disposed over at least one sidewall of a thyristor 104. A gate dielectric 124 may be disposed between the control gates 106 and each of the associated thyristors 104. For example, each of the memory cells 102 may include a control gate 106 disposed on the gate dielectric 124 on a single sidewall of the thyristors 104 or may include control gates 106 disposed on opposite sidewalls of the thyristors 104. As a non-limiting example, the control gates 106 may extend in the second direction Y and may be disposed over at least one of the sidewalls of the thyristors 104 aligned in the columns extending in the second direction Y. The control gates 106 or the gate dielectric 124, if present, may directly contact the p base region 114 of the thyristors 104 without contacting the n base region 112 or the cathode region 116 flanking the p base region 114. Each of the control gates 106 may be operably connected to a voltage source (not shown) for biasing the thyristors 104 of the semiconductor device 100.

Each of the conductive straps 108 may include amorphous silicon 128 and a conductive material 130 and may be disposed between the insulative material 150 and a plurality of the thyristors 104. The conductive straps 108 may function as an electrical interconnect to the cathode regions 116 of one or more of the thyristors 104 of the semiconductor device 100. As shown in FIG. 2A, in some embodiments, the conductive straps 108 may each extend in the direction X, underlying at least one of the rows. The cathode region 116 of each of the thyristors 104 in the row may be electrically coupled with an underlying one of the conductive straps 108. Thus, the conductive straps 108 may be aligned substantially perpendicular to the control gates 106. Each of the conductive straps 108 may include an interconnect region 132 that may remain exposed to enable the semiconductor device 100 to be electrically coupled with another device (not shown), such as an underlying conventional logic device. Vertical surfaces of the conductive straps 108 may be aligned with sidewalls of the thyristors 104 in one of the rows.

Conductive lines 134 may be disposed over a plurality of the memory cells 102 of the semiconductor device 100. For example, each of the conductive lines 134 may be disposed over and in contact with the anode regions 110 of each of the memory cells 102 arranged in one of the rows and may, thus, function as an electrical interconnect to each of the anode regions 110. Each of the conductive lines 134 may be, for example, disposed above and substantially perpendicular to one of the control gates 106.

During operation of the semiconductor device 100, the control gates 106 may be biased using the voltage source such that a depletion base region is created, providing current flow from the cathode region 116 to the anode region 110 of each of the thyristors 104. The conductive lines 134 may each function as a data/sense line (i.e., bit line) and, during operation of the semiconductor device 100, may create a forward bias electrically coupling the memory cells 102 of the semiconductor device 100. The conductive straps 108 may function as electrical contacts to the cathode regions 116 of each of the memory cells 102.

Figure 2B:
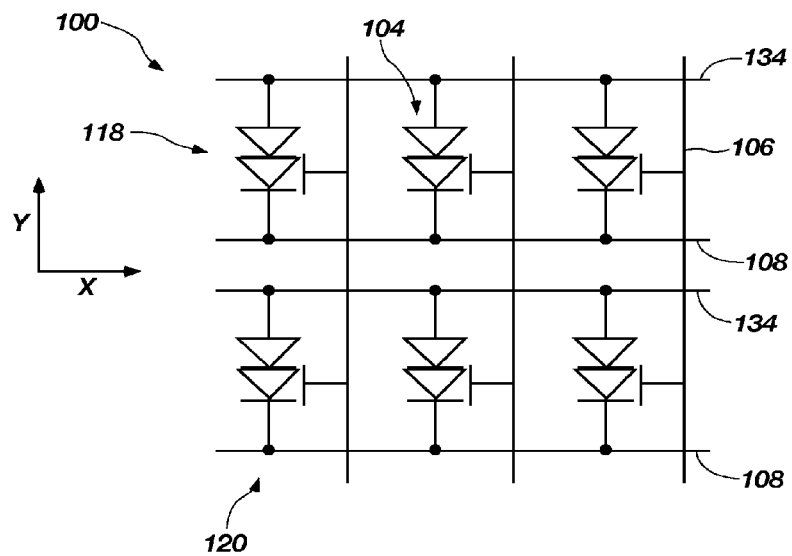
FIG. 2B illustrates an electrical circuit diagram representing the portion of the semiconductor device illustrated in FIG. 2A.

FIG. 2B is an electrical diagram of a portion of the semiconductor device 100 shown in FIG. 2A. The memory cells 102 are disposed in a plurality of rows 118 and columns 120 and each include a thyristor 104 and a control gate 106. Each of the control gates 106 is electrically coupled to the thyristors 104 in one of the rows 118 and each of the conductive straps 108 and the conductive lines 134 are electrically coupled to the thyristors 104 in one of the columns 120.

Figure 3A:
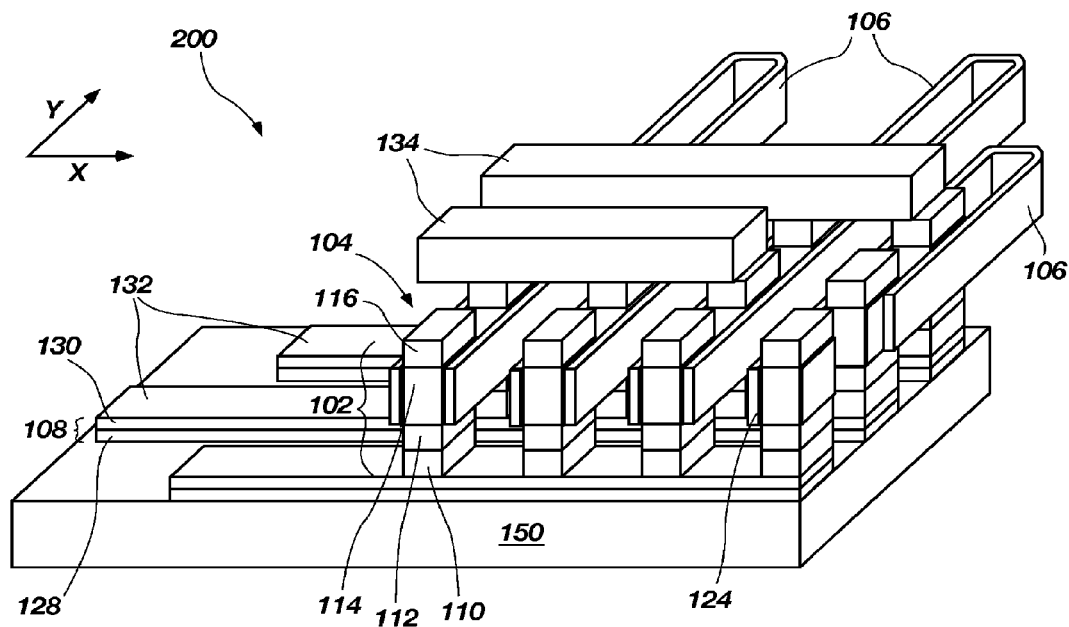
FIG. 3A illustrates a perspective view of a portion of another semiconductor device in accordance with an embodiment of the present invention.

FIG. 3A is an illustration of a semiconductor device 200 having substantially the same configuration as the semiconductor device 100 shown in FIG. 2A with the exception of the ordering of the vertically superposed, doped regions of the thyristors 104. For example, each of the thyristors 104 may be reversed with respect to those shown in FIG. 2A so that the anode region 110 is disposed on one of the conductive straps 108, the n base region 112 is disposed over the anode region 110, the p base region 114 is disposed between the n base region 112 and the cathode region 116. The memory cells 102 may be arranged in an array that includes a plurality of rows extending in a first direction X and a plurality of columns extending in a second direction Y, as described with respect to FIG. 2A. The control gates 106 of the semiconductor device 200 may be disposed along the p base region 114 of the thyristors 104.

Each of the control gates 106 may be operably connected to a voltage source (not shown) for biasing the memory cells 102 of the semiconductor device 200. During operation of the semiconductor device 200, a voltage may be applied to the conductive lines 134 which may function as cathodes while the conductive straps 108 may each function as a data/sense line (i.e., bit line) and may create a forward bias electrically coupling the memory cells 102 of the semiconductor device 200.

Figure 3B:
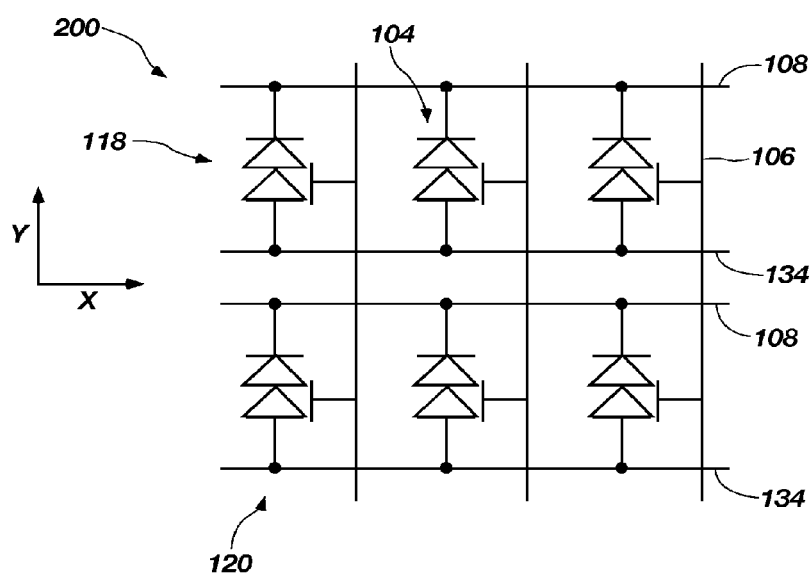
FIG. 3B illustrates an electrical circuit diagram representing the portion of the another semiconductor device illustrated in FIG. 3A.

FIG. 3B is an electrical diagram of a portion of the semiconductor device 200 shown in FIG. 3A. The memory cells 102 are disposed in a plurality of rows 118 and columns 120 and each include a thyristor 104 and a control gate 106. Each of the control gates 106 is electrically coupled to the thyristors 104 in one of the rows 118 and each of the conductive straps 108 and the conductive lines 134 are electrically coupled to the thyristors 104 in one of the columns 120.

Figure 4:
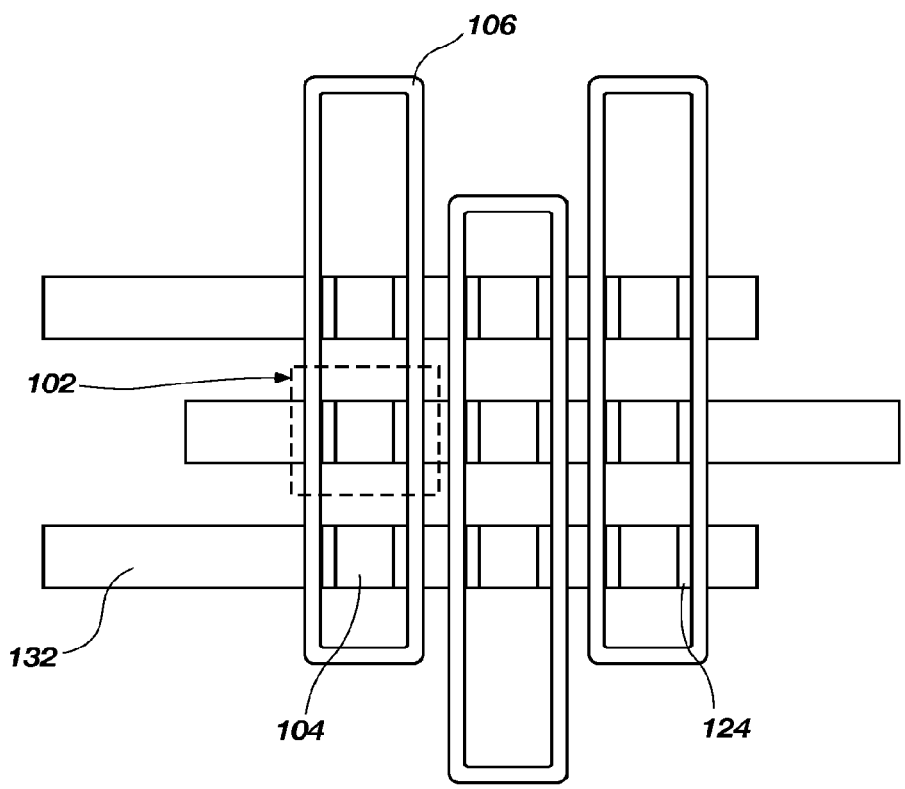
FIG. 4 illustrates a top-down plan view of a portion of a semiconductor device in accordance with the embodiments of the present invention illustrated in FIGS. 2A and 2B.

FIG. 4 is a fragmentary top-down view of a portion of the semiconductor devices 100 and 200 shown in FIGS. 2A though 3B. The control gates 106 extend laterally in rows and the conductive lines 134 extend vertically thereover in columns. In the semiconductor device 100 shown in FIGS. 2A and 2B, the conductive lines 134 overlie a doped region (not shown) comprising a p-type crystalline silicon material. In the semiconductor device 200 shown in FIGS. 3A and 3B, the conductive lines 134 overlie a doped region (not shown) comprising a an n-type crystalline silicon material. Each of the memory cells 102 has a cell size of $4F^2$. The $4F^2$ cell size is achieved by providing the conductive strap 108 as a cathode or bit line during operation of the semiconductor device 100.

With reference to FIGS. 5-15, a method of forming the semiconductor devices 100 and 200 including a plurality of memory cells 102, each including a thyristor 104, such as those shown in FIGS. 2A through 4, will now be described, wherein like elements are designated by like numerals. A donor wafer 136 may be formed that includes a substrate 138 having a doped material 140, the conductive material 130 and amorphous silicon 128 formed thereon. The substrate 138 may include a fabrication substrate, such as a full or partial wafer of semiconductor material (e.g., silicon, silicon germanium, gallium arsenide, indium phosphide, etc.), a full or partial silicon-on-insulator (SOI) type substrate, such as a silicon-on-glass (SOG), silicon-on-ceramic (SOC), or silicon-on-sapphire (SOS) substrate, or any other known, suitable fabrication substrate. As used herein, the term "wafer" includes conventional wafers as well as other bulk semiconductor substrates. In one embodiment, the substrate 138 may include a crystalline silicon material. The substrate 138 may be doped or undoped. In one embodiment, the substrate 138 may be doped with a p-type impurity to form a p-type silicon material that may be used to form the semiconductor device 100 shown in FIG. 2A. In another embodiment, the substrate 138 may be doped with an n-type impurity to form an n-type silicon material that may be used to form the semiconductor device 200 shown in FIG. 3A.

As described with respect to FIGS. 2A and 3A, the doped material 140 (FIG. 5) may include a highly doped n-type material that may be used to form the cathode regions 116 of the semiconductor device 100 shown in FIG. 2A or a highly doped p-type material that may be used to form the anode regions 110 of the semiconductor device 200 shown in FIG. 3A, as will be described in further detail. The doped material 140 may be formed by performing a conventional ion implantation on the substrate 138. In one embodiment, the doped material 140 may be formed to include a highly doped n-type silicon material (i.e., n+ material) by implanting ions of an n-type impurity, such as arsenic (As), phosphorous (P) or antimony (Sb), into the substrate 138. The doped material 140 including the n+ material may be used to form the cathode regions 116 of the semiconductor device 100 shown in FIG. 2A, as will be described in further detail. In another embodiment, the doped material 140 may be formed to include a highly doped p-type silicon material (i.e., p+ material) by implanting ions of a p-type impurity, such as boron (B), into the substrate 138. The doped material 140 including the p+ material may be used to form the anode regions 110 of the semiconductor device 200 shown in FIG. 3A, as will be described in further detail. The doped material 140 may be formed before or after the conductive material 130 and the amorphous silicon 128 have been formed on the donor wafer 136. In another embodiment, the doped material 140 may be formed by epitaxially growing or depositing doped silicon germanium, doped gallium arsenide, or doped gallium nitride on the substrate 138 to improve mobility and provide better control over diffusion of dopants in the doped material 140.

The conductive material 130 may be a low resistivity material including, but not limited to, a phase change material, titanium, titanium silicide, titanium oxide, titanium nitride, tantalum, tantalum silicide, tantalum oxide, tantalum nitride, tungsten, tungsten silicide, tungsten oxide, tungsten nitride, other metals, metal silicide, metal oxide, or metal nitride materials, or combinations thereof, including multiple, different conductive materials. In one embodiment, the conductive material 130 may be formed from titanium nitride because titanium nitride has good adherence or adhesion to many materials, such as the material used as the substrate 138. Titanium nitride also has a high melting point (about 3000° C.), which makes it unaffected by high processing temperatures. Titanium nitride also makes excellent ohmic contact with other conductive materials. Titanium nitride is also commonly used in semiconductor fabrication and, therefore, may easily be incorporated into conventional fabrication processes. In one embodiment, the conductive material 130 is a titanium-rich titanium nitride, such as metal mode titanium nitride (MMTiN). The conductive material 130 may also be formed from multiple conductive materials. In another embodiment, the conductive material 130 may be formed from a metal, such as titanium, tungsten or aluminum, with a layer of titanium nitride material formed thereon. The thickness of the conductive material 130 may be optimized, depending on the material, to provide a low ohmic contact. For example, if the conductive material 130 is titanium nitride, such as MMTiN, the conductive material 130 may have a thickness of from about 10 nm to about 50 nm. The conductive material 130 may be formed by a deposition technique known in the art, such as, for example, atomic layer deposition (ALD), chemical vapor deposition (CVD), or plasma vapor deposition (PVD).

The amorphous silicon 128 may be formed over the conductive material 130 by a deposition technique known in the art, such as, for example, ALD, CVD, or PVD. In one embodiment, the amorphous silicon 128 may be formed on the conductive material 130 by PVD, followed by chemical-mechanical planarization (CMP). The thickness of the amorphous silicon 128 may be from about 10 nm to about 80 nm.

The donor wafer 136 may also include a transfer region 146 formed by implanting an atomic species into the substrate 138. The atomic species may be hydrogen ions, ions of rare gases, also termed inert or noble gases, or ions of fluorine. The atomic species may be implanted into the substrate 138 of the donor wafer 136 to form an implanted zone 148, represented in FIG. 5 by broken lines. The atomic species may be implanted into the substrate 138 before or after the conductive material 130 or the amorphous silicon 128 are formed on the substrate 138. The implanted zone 148 may be formed at a desired depth in the substrate 138, which is dependent on parameters, such as implant dose and energy of the atomic species, as known in the art. The depth of the implanted zone 148 may be controlled based on a desired thickness of the thyristors 104 shown in FIGS. 2A and 3A. The implanted zone 148 may include microbubbles or microcavities including the implanted atomic species, which provide a weakened region within the substrate 138. The donor wafer 136 may be thermally treated at a temperature above that at which implantation is effected, but below the melting temperature of the conductive material 130, to effect crystalline rearrangement in the donor wafer 136 and coalescence of the microbubbles or microcavities. As described below, the donor wafer 136 may be cleaved at the implanted zone 148 to form a semiconductor structure 172' shown in FIG. 6.

Figure 6:
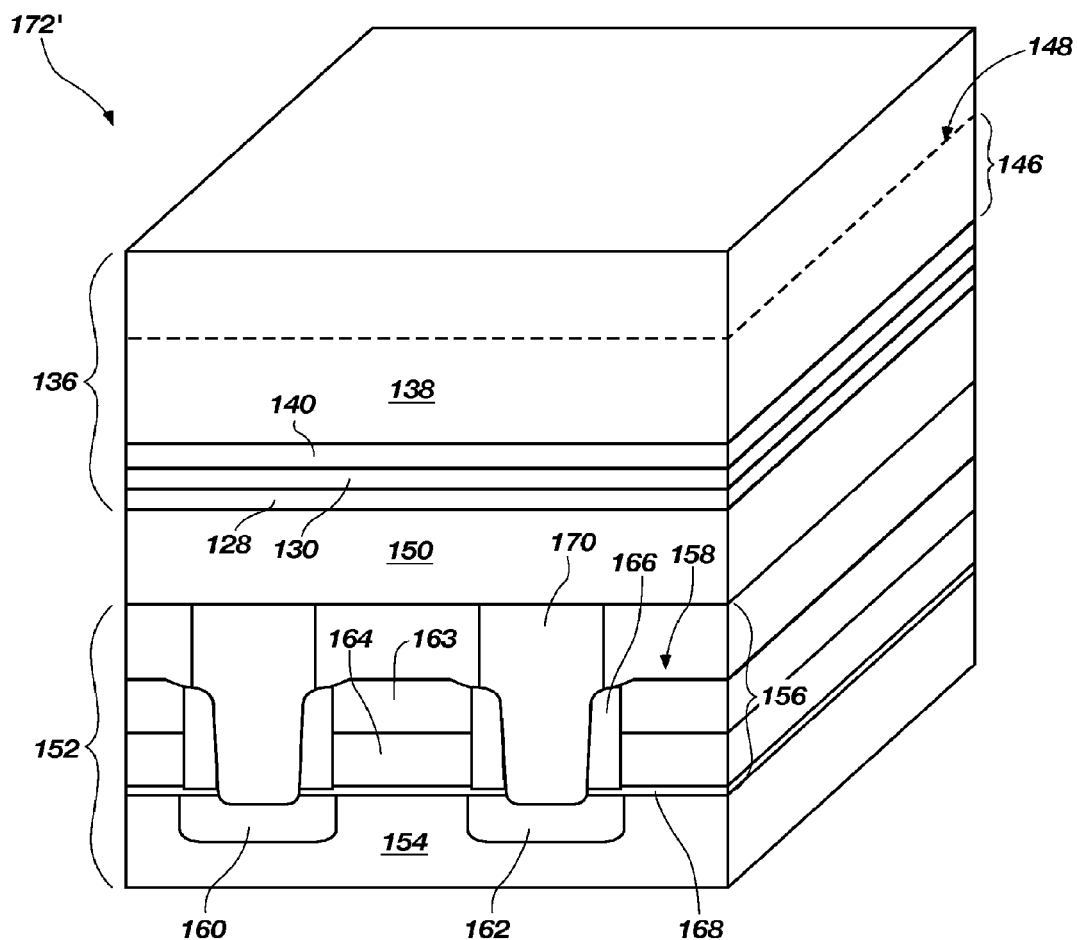

As shown in FIG. 6, the donor wafer 136 may be superposed onto the insulative material 150 overlying an acceptor wafer 152 such that the amorphous silicon 128 of the donor wafer 136 is in contact with the insulative material 150. To form the acceptor wafer 152, the insulative material 150 may be formed over a bulk substrate 154 using a conventional deposition technique known in the art, such as, for example, ALD, CVD, or PVD. For example, the bulk substrate 154 may include a silicon substrate. An at least partially fabricated conventional logic device, such a complementary metal-oxide-semiconductor (CMOS) device 156, may optionally be formed on the bulk substrate 154 and may be formed by conventional techniques. For example, the CMOS device 156 may include an array of field effect transistors (FETs) 158 disposed between source regions 160 and drain base regions 162 in the bulk substrate 154. Each of the FETs 158 may include a gate dielectric 163 and a gate electrode 164 disposed between spacers 166. A dielectric material 168 may, optionally, be formed between the bulk substrate 154 and the gate electrode 164 of each of the FETs 158. The CMOS device 156 may further include a plurality of line interconnects 170 interconnecting the FETs 158.

The amorphous silicon 128 of the donor wafer 136 may then be bonded to the insulative material 150 of the acceptor wafer 152 by exposure to heat. Prior to bonding the donor wafer 136 to the acceptor wafer 152, at least one of a surface of the amorphous silicon 128 and a surface of the insulative material 150 may, optionally, be treated to improve the bond strength therebetween. Such treatment techniques are known in the art and may include, for example, chemical activation, plasma activation or implant activation. For example, the surface of the insulative material 150 may be treated with a dilute ammonia hydroxide solution or hydrogen fluoride solution. The surface of the amorphous silicon 128 may also be exposed to a plasma of, for example, argon, to form a plasma-activated surface. Activating at least one of the surface of the amorphous silicon 128 and the surface of the insulative material 150 may increase the kinetics of the subsequent bonding therebetween due to an increased mobility of ionic species (for example, hydrogen) created on the surface of the amorphous silicon 128 and the surface of the insulative material 150.

Referring still to FIG. 6, the amorphous silicon 128 of the donor wafer 136 may be contacted and bonded with the insulative material 150 of the acceptor wafer 152 to form a semiconductor structure 172'. The amorphous silicon 128 may be bonded to the insulative material 150 by, for example, heating the semiconductor structure 172' to a temperature of less than about 600° C., such as from about 300° C. to about 400° C. If the insulative material 150 is formed from silicon dioxide, silicon-oxide bonds may form between the amorphous silicon 128 and the insulative material 150. Because the conductive material 130 may be formed of a metal or other heat sensitive material, the temperature to which the semiconductor structure 172' is exposed may be less than the melting point of the conductive material 130. The amorphous silicon 128 and the insulative material 150 may also be bonded without heat, such as at ambient temperature (from about 20° C. to about 25° C.). Pressure may also be applied to the donor wafer 136 and the acceptor wafer 152 to bond the amorphous silicon 128 to the insulative material 150. Once the donor wafer 136 is bonded to the acceptor wafer 152, the conductive material 130 from the donor wafer 136 may form a buried conductive material, which is disposed between the insulative material 150 and the substrate 138.

Figure 7:
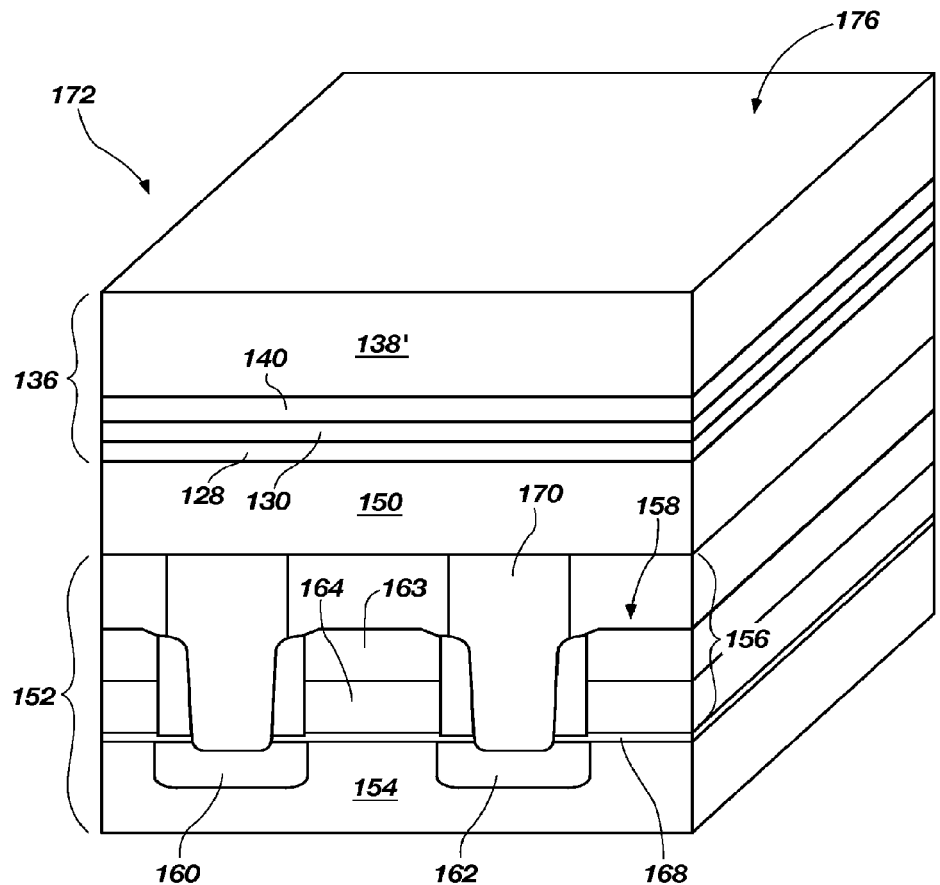

The transfer region 146 may then be removed from the substrate 138, to form the semiconductor structure 172 shown in FIG. 7. The transfer region 146 may be removed by techniques known in the art, such as by applying a shear force to the implanted zone 148 (FIG. 6) or by applying heat or a jet gas stream at the implanted zone 148. The hydrogen or other ions implanted in implanted zone 148 produce a weakened region in the substrate 138, which is susceptible to cleavage. The remaining portion of the substrate 138' may have a thickness, for example, of from about 50 nm to about 30 nm (from about 500 Å to about 3000 Å). After separation of the transfer region 146 from the remaining portion of the substrate 138', an exposed surface 176 of the substrate 138' may be undesirably rough. The exposed surface 176 of the substrate 138' may be smoothed to facilitate further processing as described, according to techniques known in the art such as, for example, one or more of grinding, wet etching, and chemical-mechanical polishing (CMP).

The semiconductor structure 172 may be formed by modification of SMART-CUT® layer transfer technology. The SMART-CUT® layer transfer technology is described in detail in, for example, U.S. Pat. No. RE 39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., and U.S. Patent Application Publication No. 2006/0099776 to DuPont. However, other processes suitable for manufacturing a semiconductor structure having a buried conductive material may also be used, if sufficiently low process temperatures are maintained. In conventional implementation of the SMART-CUT® layer transfer technology, donor wafers and acceptor wafers are bonded together using a high temperature anneal. The temperature used to bond the donor and acceptor wafers is from about 1000° C. to about 1300° C. However, due to the presence of the conductive material 130 in the semiconductor structures described herein, the semiconductor structure of the present invention would be unable to withstand exposure to such temperatures without thermal damage. Accordingly, as described above, lower temperatures may be used to bond an acceptor wafer 152 and donor wafer 136. Exemplary methods for forming the semiconductor structure 172 are described in detail in U.S. patent application Ser. No. 12/715,704 filed on Mar. 2, 2010 and titled "SILICON-METAL-ON-INSULATOR STRUCTURES, METHODS OF FORMING SUCH STRUCTURES, AND SEMICONDUCTOR DEVICES INCLUDING SUCH STRUCTURES". While FIGS. 6 and 7 illustrate one embodiment of a method of forming the semiconductor structure 172, any of the methods described in U.S. patent application Ser. No. 12/715,704, or other known methods may be utilized to form the semiconductor structure 172.

Figure 8:
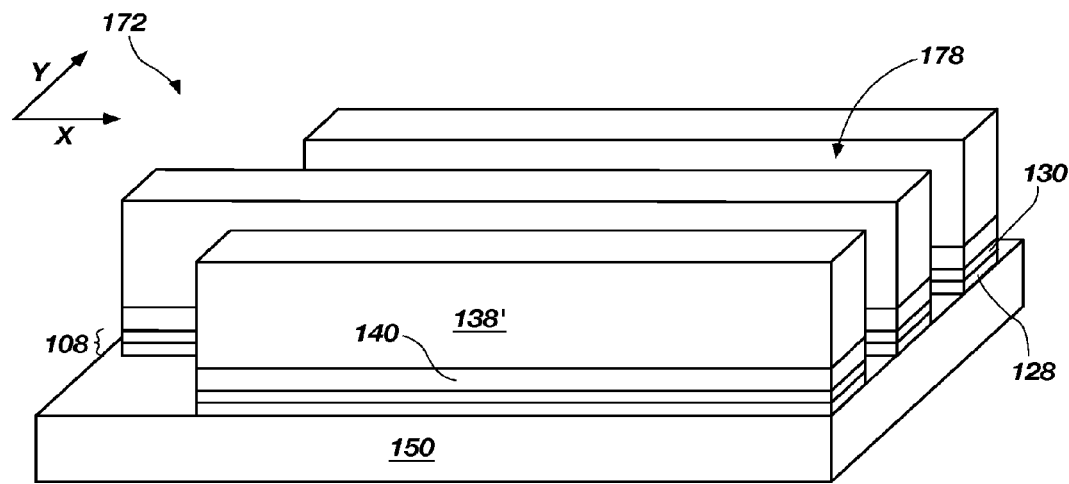

Referring to FIG. 8, portions of the substrate 138', the doped material 140, the conductive material 130 and the amorphous silicon 128 may be removed to form the conductive straps 108, each of which may function as a cathode interconnection in the semiconductor device 100 shown in FIG. 2A or as a bit line in the semiconductor device 200 shown in FIG. 3A. Forming the semiconductor structure 172, including the buried conductive material 130 by the bonding and material transfer process described with respect to FIGS. 5 through 7 enables formation of the conductive straps 108, which is not possible using either a conventional silicon wafer or a conventional silicon-on-insulator (SOI) structure. For the sake of simplicity, the acceptor wafer 152 underlying the insulative material 150 in FIGS. 6 and 7 has been omitted from the remaining figures. The conductive straps 108 may be formed by depositing a mask material (not shown) over the substrate 138' and patterning the mask material to form apertures through which surfaces of the substrate 138' are exposed. The mask material may include, for example, a photoresist material, an oxide material, transparent carbon or amorphous carbon. Methods of forming and patterning the mask material are known in the art and, therefore, are not described in detail herein. Portions of the substrate 138', the doped material 140, the conductive material 130 and the amorphous silicon 128 exposed through the apertures in the mask material may be removed to form slots 178 between remaining portions of each of the substrate 138', the doped material 140, the conductive material 130 and the amorphous silicon 128. The remaining portions of the mask material may then be removed.

By way of non-limiting example, the slots 178 may be formed extending in the first direction X through each of the substrate 138', the doped material 140, the conductive material 130 and the amorphous silicon 128. Portions of the substrate 138', the doped material 140, the conductive material 130 and the amorphous silicon 128 may be removed using, for example, an anisotropic reactive ion (i.e., plasma) etching process, to expose the underlying insulative material 150. For example, if the substrate 138' and the doped material 140 are each formed from a doped crystalline silicon material, a reactive ion etching (RIE) process using oxygen ($O_2$) gas, tetrafluoromethane ($CF_4$) gas and hydrogen bromide (HBr) gas may be performed to selectively remove portions of the doped silicon material selective to the mask material and the insulative material 150. If the conductive material 130 is formed from titanium nitride or tungsten silicide, a mixture of a bromine-containing gas and a fluorine-containing gas or a mixture of a fluorine-containing gas and a chlorine-containing gas may be used to remove the titanium nitride and the amorphous silicon material selective to the mask material and the insulative material 150.

Figure 9:
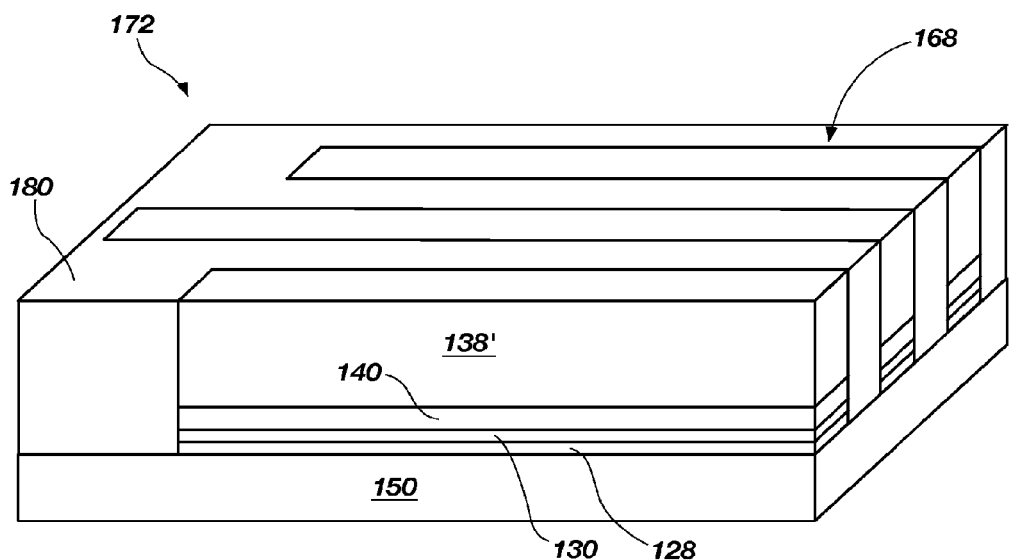

As shown in FIG. 9, a fill material 180 may be formed over the semiconductor structure 172. By way of non-limiting example, the fill material 180 may include a dielectric material such as an oxide material, a nitride material or a spin-on-glass (SOG) material, and may be deposited using a chemical vapor deposition process. After forming the fill material 180, a chemical-mechanical polishing (CMP) process may be used to remove portions thereof so that an upper surface 174 of the semiconductor structure 172 is substantially planar.

Figure 10:
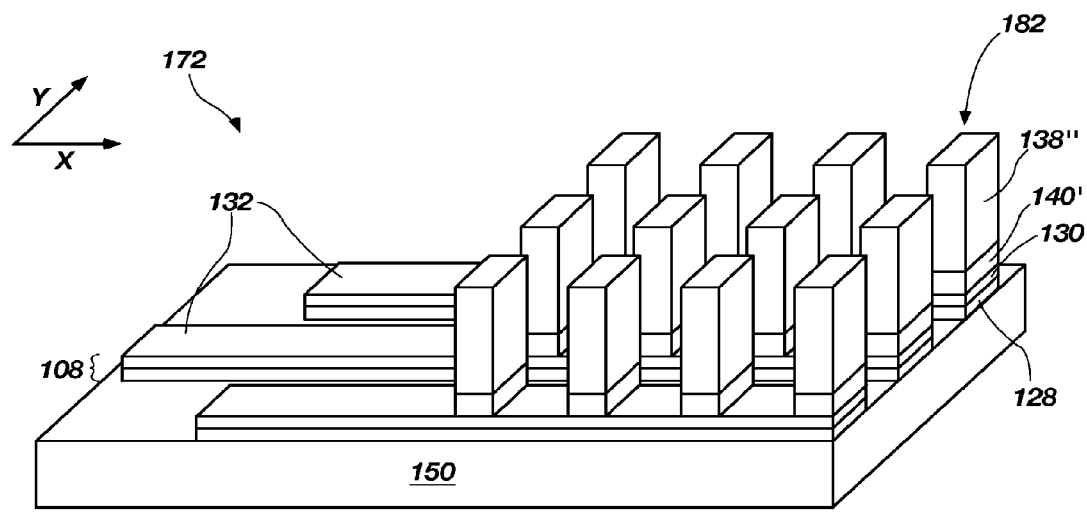

FIG. 10 shows the semiconductor structure 172 after portions of the substrate 138' and the doped material 140 (FIG. 9) have been removed to form a plurality of pillars 182 and to expose the interconnect regions 132 of the conductive straps 108. In the remaining figures, the fill material 180 has been omitted for simplicity and clarity of illustration. Each of the pillars includes a remaining portion of the substrate 138" and the doped material 140'. In one embodiment (shown in FIG. 10), pillars 182 may each include a cathode region 116 and a p base region 114 to form one of the thyristors 104 of the semiconductor device 100 shown in FIG. 2A. In another embodiment (not shown), each of the pillars 182 may include the anode regions 110 and the n base regions 112 to form the thyristors 104 of the semiconductor device 200 shown in FIG. 3A. The pillars 182 may be formed by depositing a mask material (not shown) over the semiconductor structure 172 and patterning the mask material to form apertures through which surfaces of the substrate 138' are exposed. Optionally, surfaces of the fill material 180 (FIG. 9) may be exposed through the mask material. The mask material may include, for example, a photoresist material, an oxide material, transparent carbon or amorphous carbon. Methods of forming and patterning the mask material are known in the art and, therefore, are not described in detail herein. Portions of the substrate 138' and the doped material 140 exposed through the apertures in the mask material may be removed to form the pillars 182 and to expose the interconnect regions 132 of the conductive straps 108. For example, if the substrate 138' and the doped material 140 are each formed from a doped crystalline silicon, a reactive ion etching (RIE) process may be performed to selectively remove portions of the doped crystalline silicon without removing conductive material 130 from the conductive straps 108. Each of the pillars 182 may be formed to have an aspect ratio of from about 2:1 to about 20:1 and, more particularly, from about 3:1 to about 10:1. The pillars 182 shown in FIG. 10 are formed by completely removing the doped material 140 (FIG. 9) to expose surfaces of the conductive material 130 therebetween. As configured, the pillars 182 may be formed by removing only the substrate 138' (FIG. 9), or a portion thereof, such that at least a portion of the doped material 140 remains over the conductive straps 108, as shown in broken lines.

In conventional methods of forming vertical thyristors 12, such as that shown in FIG. 1A, the cathode region 24 is formed by conventional doping processes wherein the dopants are implanted from the upper surface of the vertical thyristor 12 to the cathode region 24. Such doping processes often result in an undesirable concentration or distribution of dopants or impurities and, thus, are not effective for introducing dopants or impurities into substantial depths of material, such as the cathode region 24 of the vertical thyristor 12 shown in FIG. 1A. In contrast, the bonding and material transfer process described with respect to FIGS. 5 through 7 enables doping of the substrate 138, 138' and the doped material 140 prior to material transfer. Accordingly, the qualities of the substrate 138, 138' and the doped material 140, such as uniformity in dopant concentration or distribution, are substantially improved. Since the substrate 138, 138' and the doped material 140 may be doped before forming the pillars 182, the method of the present invention enables control and optimization of dopant concentration of cathode regions 116 and the p base regions 114 of the semiconductor device 100 shown in FIG. 2A and the anode regions 110 and the n base regions 112 of the semiconductor device 200 shown in FIG. 3A.

The pillars 182 may be formed in an array that includes a plurality of rows in which the pillars 182 are aligned in the first direction X and a plurality of columns in which the pillars 182 are aligned in the second direction Y. The substrate 138' and the doped material 140 may be removed such that the interconnect regions 132 have a staggered configuration that may be useful in electrically interconnecting the conductive straps 108 with underlying or overlying semiconductor structures (not shown).

Figure 11A:
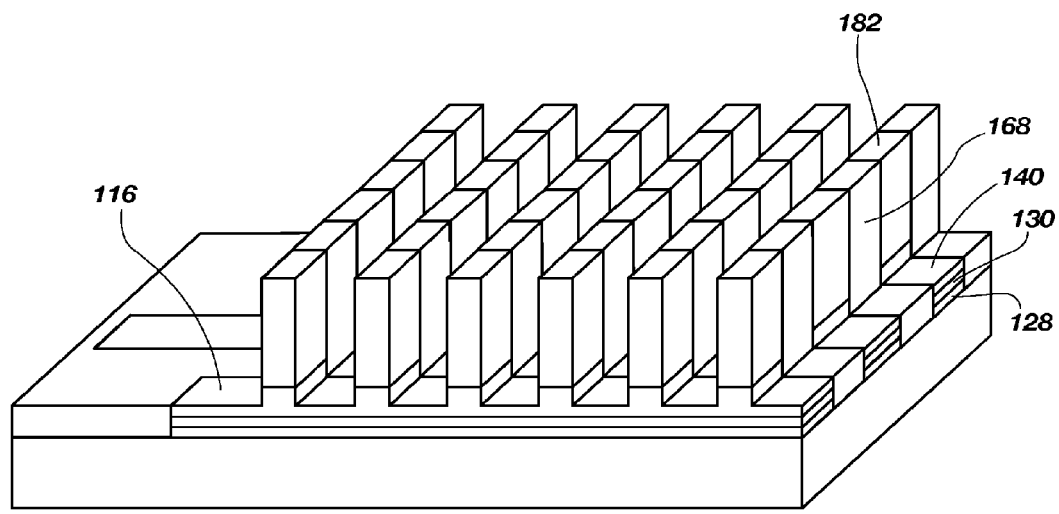
Figure 11B:
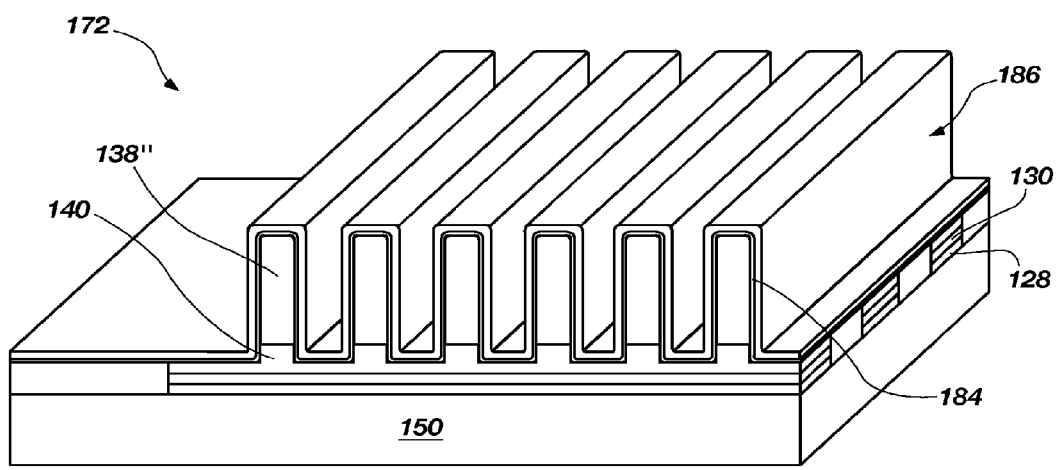
Figure 11C:
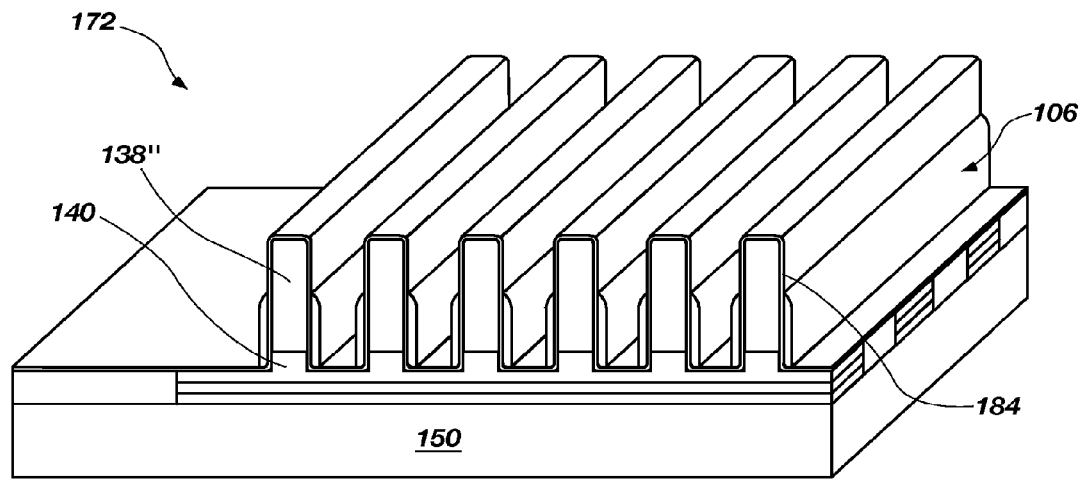

FIGS. 11A through 11C illustrate an embodiment of a method of forming the control gates 106 on the pillars 182 and are perspective views of the semiconductor structure 172 shown in FIG. 10 after a gate dielectric material 184 and a conductive material 186 have been deposited over the semiconductor device 172. FIG. 11A illustrates the semiconductor device 172 having the fill material 180 disposed between the pillars 182. As shown in FIG. 11B, a gate dielectric material 184 and a conductive material 186 may be conformally formed over the semiconductor structure 172. By way of non-limiting example, the gate dielectric material 184 may be an oxide material or a nitride material formed using, for example, a chemical vapor deposition process, a thermal oxidation process or a combination thereof. The conductive material 186 may then be formed over the gate dielectric material 184. As a non-limiting example, the conductive material 186 may be formed from titanium nitride, thallium nitride tungsten or aluminum and may be deposited using a chemical vapor deposition process. A liner material (not shown), such as a polysilicon material having a thickness of between about 50 Å and 100 Å may be deposited over the conductive material 186. Referring to FIG. 11C anisotropic dry etching process may be performed to remove portions of the liner and the conductive material 186 to form spacers (not shown) of the liner material overlying remaining portions of the conductive material 186. Using the spacers as a hard mask, a wet etching process using, for example, ammonium hydroxide (NH$_4$OH), hydrogen peroxide (H$_2$O$_2$) and deionized water, may be performed to undercut the conductive material 186 to form the control gates 106 shown in FIG. 12. The spacers may then be removed. For example, if the spacers comprise polysilicon, a wet etching process using tetramethylammonium hydroxide (TMAH) may be used to remove the polysilicon material selective to the control gates 106 and the gate dielectric 124. The control gates 106 and the gate dielectric 124, may be formed using any other technique known in the art.

In the embodiments shown in FIGS. 11A through 11C, the control gates 106 are formed on two (2) surfaces of the pillars 182. However, the control gates 106 may also be formed on a single side of the pillars 182. For example, after forming the control gates 106, a mask material (not shown) may be deposited over the semiconductor structure 172 and patterned to form a plurality of apertures through which surfaces of the control gates 106 on one side of the pillars 182 are exposed. A conventional etching process may be performed to remove the exposed portion of each of the control gates 106 so that the control gates 106 remains on a single side of the pillars 182.

Figure 12:
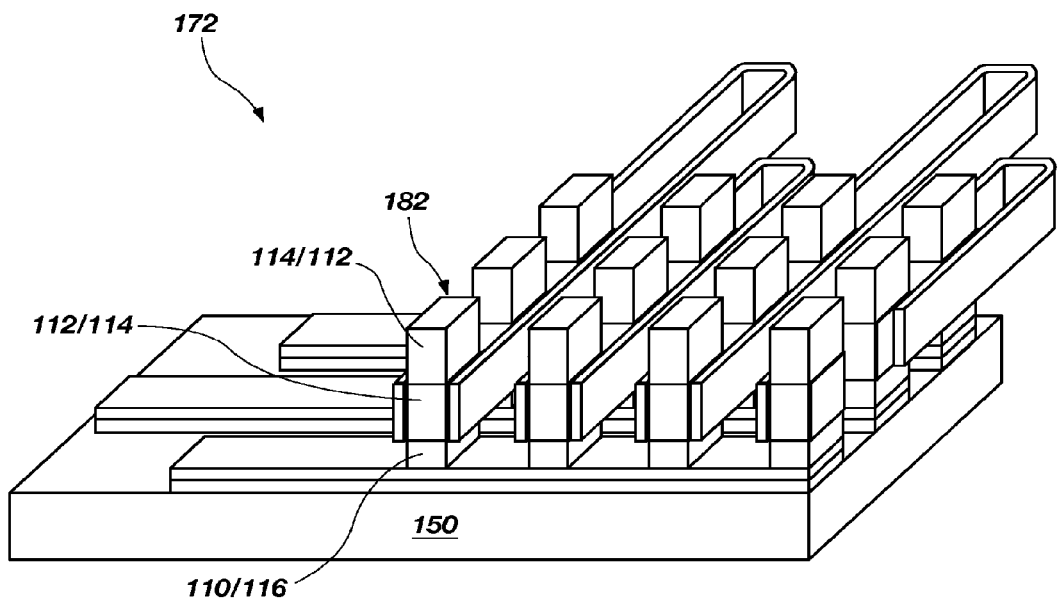

As shown in FIG. 12, the gate dielectric 124 may, optionally, be removed selective to control gates 106. An upper region of each of the pillars 182 may be implanted with a dopant or impurity to form the n base regions 112 of the semiconductor device 100 shown in FIG. 2A, or the p base regions 114 of the semiconductor device 200 shown in FIG. 3A. Exposed portions of the pillars 182 may be doped using conventional methods, such as an ion implantation process or a high temperature diffusion process. In one embodiment, the n base regions 112 of the thyristors 104 of the semiconductor device 100 shown in FIG. 2A may be formed by exposing the semiconductor device 172 to an n-type dopant, such as phosphorous or arsenic, such that an n-type material is formed. In another embodiment, the p base regions 114 of the thyristors 104 of the semiconductor device 200 shown in FIG. 3A may be formed by exposing the semiconductor device 172 to a p-type dopant, such as boron or aluminum, such that a p-type material is formed. As another example, a thin film of a highly doped p-type material or a highly doped n-type material (not shown) may be deposited over exposed surfaces of the pillars 182 and a thermal anneal may be performed during which dopants migrate from the highly doped p-type material or the highly doped n-type material into the pillars 182 producing the desired doped material (i.e., the n base regions 112 shown in FIG. 2A or the p base regions 114 shown in FIG. 3A).

Figure 13:
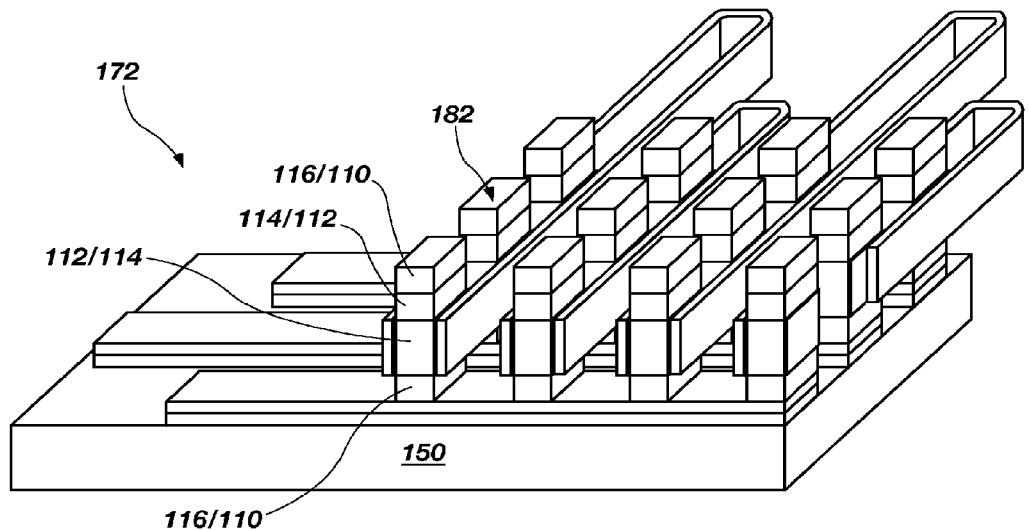

As shown in FIG. 13, an upper region of each of the pillars 182 may be implanted with a dopant or impurity to form the anode regions 110 of the semiconductor device 100 shown in FIG. 2A, or the cathode regions 116 of the semiconductor device 200 shown in FIG. 3A. Exposed portions of the pillars 182 may be doped using conventional methods, as described with respect to FIG. 12. In one embodiment, the anode regions 110 of the semiconductor device 100 shown in FIG. 2A may be formed by exposing the semiconductor device 172 to a p-type dopant or by depositing a highly doped p-type material on exposed surfaces of the pillars 182 and performing a thermal anneal, such that the highly doped p-type material is formed. In another embodiment, In one embodiment, the cathode regions 116 of the semiconductor device 200 shown in FIG. 3A may be formed by exposing the semiconductor device 172 to an n-type dopant or by depositing a highly doped n-type material on exposed surfaces of the pillars 182 and performing a thermal anneal, such that the highly doped p-type material is formed.

Figure 5:
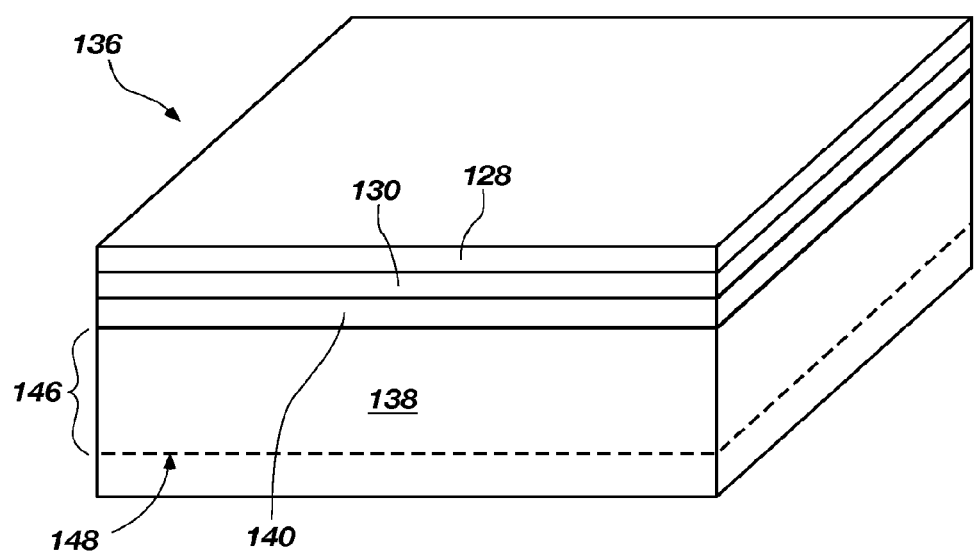
FIGS. 5 through 14 illustrate perspective and cross-sectional views of a portion of a semiconductor structure during various stages of fabrication in accordance with embodiments of the present invention.
Figure 14:
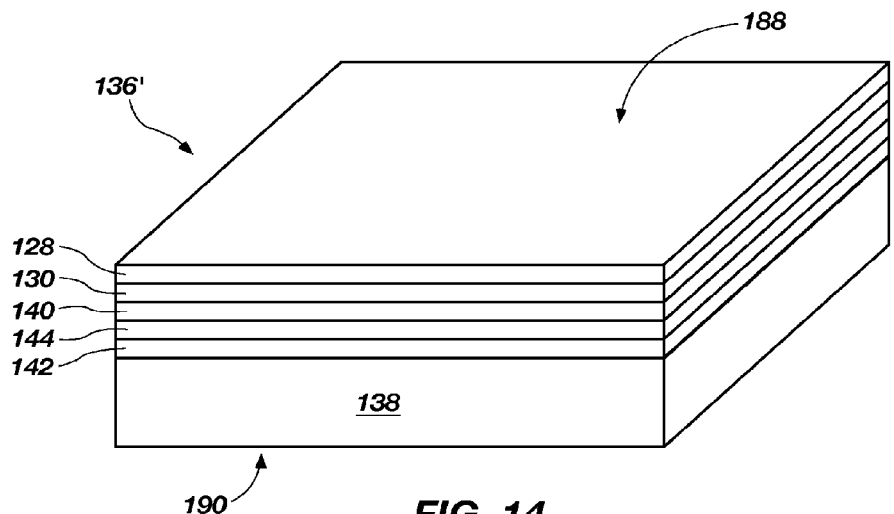

While formation of the anode regions 110 and the n base regions 112 of the semiconductor device 100 shown in FIG. 2A or the cathode regions 116 and the p base regions 114 of the semiconductor device 200 shown in FIG. 3A are illustrated above as being performed after the acts shown in FIG. 5, these regions may also be formed prior to forming the semiconductor structure 172 by the bonding and material transfer process described with respect to FIGS. 5 through 7. As shown in FIG. 14, a donor wafer 136' may be formed having a structure similar to the donor wafer 136 shown in FIG. 5, and may additionally include a first material 142 and a second material 144. The first material 142 and the second material 144 may be formed by a conventional doping process, which may be performed by exposing either a first major surface 188 or a second major surface 190 of the donor wafer 136' to a dopant or impurity. In one embodiment, the substrate 138 may include a highly doped n-type material, the first material 142 may include a p-type material, the second material 144 may include an n-type material and the doped material 140 may include a highly doped p-type material such that, upon formation of the pillars 182 as described with respect to FIG. 10, the thyristors 104 of the semiconductor device 100 shown in FIG. 2A are formed. In another embodiment, the substrate 138 may include a highly doped p-type material, the first material 142 may include an n-type material, the second material 144 may include a p-type material and the doped material 140 may include a highly doped n-type material such that, upon formation of the pillars 182 as described with respect to FIG. 10, the thyristors 104 of the semiconductor device 200 shown in FIG. 3A are formed. Doping the substrate 138 prior to the bonding and material transfer process described with respect to FIGS. 5 through 7 thus enables the concentration and distribution of dopants therein to be controlled and optimized.

During use and operation, a voltage may be applied to the control gate 106, causing an electrical current to flow from the cathode region 116 to the anode region 110 of the thyristors 104 shown in FIGS. 2A through 3B. During formation of the control gates 106, overlap between the control gates 106 and the associated p base regions 114 of the thyristors 104 may occur. Such overlap may create capacitance and increase leakage current during operation of the completed device, thus, limiting the density of the array. Accordingly, the p base regions 114 and the associated control gates 106 may be formed to minimize overlap of the control gates 106 with the cathode regions 116 and the n base regions 112 flanking the p base regions 114. For example, portions of the control gates 106 that extend above the p base regions 114 may be removing using, for example, a conventional plasma etching process so that the control gates 106 do not extend beyond interfaces between the p base regions 114 and each of the cathode regions 116 and n base regions 112.

Referring back to FIGS. 2A and 3A, the conductive lines 134 may be formed over and in contact with the thyristors 104 to form the semiconductor devices 100 and 200. The conductive lines 134 may be formed by depositing a conductive material and patterning the conductive material to form conductive lines extending in the first direction X, substantially perpendicular to the control gates 106. In one embodiment, the conductive lines 134 may be formed using a conventional damascene or subtractive process. For example, a conductive material (not shown) may be formed over the semiconductor structure 172 (FIG. 12) and portions thereof may be removed through apertures in a photoresist material to define the conductive lines 134. In another embodiment, the conductive lines 134 may be formed using a conventional lithographic process. For example, a sacrificial dielectric material (not shown) may be deposited over the semiconductor structure 172 and a pattern of trenches (not shown) may be formed therein using a conventional lithographic process. Each of the trenches may be formed in locations at the conductive lines 134 are to be formed. A conductive material may be deposited over the semiconductor structure 172 to fill the trenches and a chemical-mechanical polishing process may be used to remove a portion of the conductive material overlying the dielectric material to form the conductive lines 134.

Furthermore, after forming one of the semiconductor devices 100 and 200 respectively shown in FIGS. 2A and 3A, the methods shown in FIGS. 5-13 may be repeated to form a multi-level semiconductor device including a plurality of vertically-stacked semiconductor devices, memory or logic and having increased memory density.

As previously described, the conductive lines 134 function as data lines (i.e., bit lines) during operation of the semiconductor device 100 shown in FIGS. 2A and 2B and as cathodes during operation of the semiconductor device 200 shown in FIGS. 3A and 3B.

Figure 15:
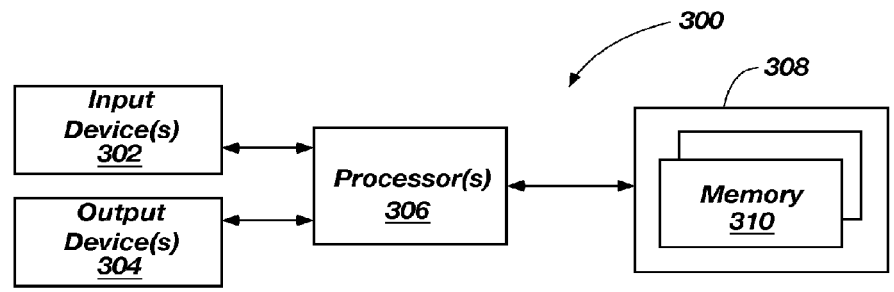
FIG. 15 illustrates a simplified block diagram of a system implemented according to one or more embodiments of the present invention described herein.

FIG. 15 illustrates a simplified block diagram of an electronic system 300 implemented according to one or more embodiments described herein. The electronic system 300 includes at least one input device 302, at least one output device 304, a memory access device, such as one or more processors 306, and one or more memory devices 308. The memory devices 308 include at least one semiconductor memory 310 incorporating at least one embodiment of the devices or methods described herein. The electronic system 300 may be part of a number of computing, processing, and consumer products. As non-limiting examples, some of these products may include personal computers, handheld devices, cameras, phones, wireless devices, displays, chip sets, set top boxes, games, and vehicles.

CONCLUSION

In some embodiments, the present invention includes memory cells that include a conductive strap disposed over a substrate, a thyristor disposed on the conductive strap and including a plurality of alternately doped, vertically superposed semiconductor regions and a control gate disposed on one of the plurality of alternately doped, vertically superposed semiconductor regions of the thyristor. The conductive strap disposed over a substrate may include a conductive material overlying amorphous silicon. At least two sidewalls of the conductive strap may be aligned with sidewalls of the thyristor. The thyristor may include an cathode region, a p base region, an n base region, and a anode region being vertically superposed over one another. The control gate may be disposed on exposed sidewalls of the n-type silicon. The control gate may be operably coupled to a voltage source. The memory cell may have a cell size of $4F^2$.

In additional embodiments, the present invention includes semiconductor devices that include at least one conductive strap, a plurality of memory cells disposed on the at least one conductive strap, and a data line electrically coupled with at least a portion of the plurality of memory cells. Each of the plurality of memory cells may include a thyristor comprising a plurality of alternately doped, vertically superposed semiconductor regions and a control gate associated with the thyristor. Each of the memory cells of the plurality may have a cell size of $4F^2$. The at least one conductive strap may be disposed on an electrically insulative material overlying a logic device formed on a wafer. The thyristor includes four doped regions of alternating dopant types forming three semiconductor junctions. The plurality of memory cells may be aligned in a plurality of rows extending in a first direction and aligned in a plurality of columns extending in a second direction perpendicular to the first direction to form an array. The thyristor of each of the plurality of memory cells comprises a highly doped n-type region disposed on the at least one conductive strap, a p-type region disposed on the highly doped n-type region, an n-type region disposed on the p-type region, and an highly doped p-type region disposed on the n-type region.

In further embodiments, the present invention includes a memory array that includes an array of memory cells including a plurality of thyristors substantially aligned in a plurality of rows in a first direction and in a plurality of columns in a second direction perpendicular to the first direction, each of the plurality of thyristors comprising a plurality of vertically superposed, alternately doped semiconductor regions, and at least one control gate electrically coupled with one of the plurality of vertically superposed, alternately doped semiconductor regions of each of the plurality of thyristors in at least one of the plurality of columns. The memory cell further includes a plurality of conductive straps, each electrically coupled with each of the plurality of thyristors aligned in one of the plurality of rows. The at least one control gate may be disposed on at least one sidewall of each of the plurality of thyristors aligned in one of the plurality of columns. Each of the plurality of thyristors in one of the plurality of rows of the array of memory cells may be disposed on one of the plurality of conductive straps. Additionally, the plurality of conductive lines may be disposed over and aligned with the thyristors aligned in one of the plurality of rows. The memory array may further include at least one logic device electrically coupled to the at least one of the plurality of conductive straps.

In yet further embodiments, the present invention includes a method of forming a semiconductor device. The method includes forming a semiconductor structure comprising amorphous silicon overlying an electrically insulative material, a conductive material overlying the amorphous silicon, a doped material overlying the conductive material and a doped crystalline silicon overlying the doped material, removing portions of each of the doped crystalline silicon, the doped material, the conductive material and the amorphous silicon to form a plurality of channels exposing the electrically insulative material, removing portions of the doped crystalline silicon and the doped material to form a plurality of pillars, each including a first doped region and a second doped region oppositely doped with respect to the first doped region, forming a control gate on at least one surface of each of the plurality of pillars, exposing the plurality of pillars to a first dopant to form a third doped region, oppositely doped with respect to the second doped region and exposing the plurality of pillars to a second dopant to form a fourth doped region. The methods may further include forming a conductive line over and in contact with the fourth doped region of each of the plurality of pillars. The semiconductor structure may be formed by forming a donor wafer comprising the amorphous silicon overlying the conductive material, the conductive material overlying the doped material disposed on a crystalline silicon wafer, implanting ions a predetermined depth into the crystalline silicon wafer, attaching the amorphous silicon of the donor wafer to the electrically insulative material on an acceptor wafer and separating a portion of the donor wafer to leave a portion of the crystalline silicon wafer, the doped material, the conductive material, and the amorphous silicon overlying a surface of the electrically insulative material of the acceptor wafer. The semiconductor structure may include a logic device formed on a wafer underlying the electrically insulative material.

In yet further embodiment, the present invention includes a system including at least memory access device and at least one semiconductor device operably coupled to the at least one memory access device. The at least one semiconductor device may include at least one conductive strap, a plurality of memory cells disposed on the at least one conductive strap and a data line electrically coupled with at least a portion of the plurality of memory cells. Each of the plurality of memory cells may include a thyristor and a control gate associated with the thyristor. The thyristors may each include a plurality of vertically superposed, alternately doped semiconductor regions. Each of the plurality of memory cells of the system may have a cell size of $4F^2$.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from scope of the invention as defined by the claims that follow, and their legal equivalents.

What is claimed is:

1. A method of forming a plurality of thyristors individually comprising a plurality of superposed, alternately doped semiconductor regions, comprising:
    joining a first substrate comprising doped thyristor cathode material with a second substrate comprising semiconductor material, the semiconductor material being in contact with the doped thyristor cathode material;
    forming a plurality of pillars individually comprising the doped thyristor cathode material and the semiconductor material;
    providing the semiconductor material of the pillars to comprise an elevationally outer anode region over the cathode region, and a p-base region and an n-base region between the anode and cathode regions; and
    forming at least one control gate laterally adjacent at least one sidewall surface of each pillar of the plurality of pillars.

2. The method of claim 1 comprising providing the n-base region to be over the p-base region.

3. The method of claim 1 comprising forming the semiconductor material to comprise at least one of doped anode region material, doped p-base region material, and doped n-base region material prior to forming the pillars.

4. The method of claim 3 comprising forming the semiconductor material to comprise at least two of doped anode region material, doped p-base region material, and doped n-base region material prior to forming the pillars.

5. The method of claim 4 comprising forming the semiconductor material to comprise doped anode region material, doped p-base region material, and doped n-base region material prior to forming the pillars.

6. The method of claim 1 comprising not providing the semiconductor material to comprise any of doped anode region material, doped p-base region material, and doped n-base region material until after forming the pillars.

7. The method of claim 1 comprising forming the pillars to be rectangular in horizontal cross section.

8. The method of claim 1 wherein the forming of the pillars comprises using multiple masking steps.

9. The method of claim 8 wherein the forming of the pillars uses only two masking steps.

10. The method of claim 1 comprising forming only a single control gate over one of the sidewall surfaces of each pillar.

11. The method of claim 1 comprising forming two control gates over laterally opposing sidewall surfaces of each pillar.

12. The method of claim 1 wherein the control gate does not laterally overlap any of the cathode.

13. The method of claim 12 wherein the control gate laterally overlaps only one of the p-base region or the n-base region.

14. A method of forming a plurality of thyristors individually comprising a plurality of superposed, alternately doped semiconductor regions, comprising:
    forming a semiconductor structure comprising a conductive material over electrically insulative material, doped thyristor cathode material over and in contact with the conductive material, and semiconductor material over and in contact with the doped thyristor cathode material;
    removing portions of the semiconductor material, the doped thyristor cathode material, and the conductive material to form a plurality of channels exposing the electrically insulative material and a plurality of conductive lines comprising the conductive material;
    after forming the channels and conductive lines, removing portions of the semiconductor material and the cathode material to form a plurality of pillars;
    providing the pillars to individually comprise an elevationally outer anode region over the cathode region, and a p-base region and an n-base region between the anode and cathode regions; and
    forming at least one control gate laterally adjacent at least one sidewall surface of each pillar of the plurality of pillars.

15. The method of claim 14 comprising providing the semiconductor structure to comprise amorphous silicon material between the electrically insulative material and the conductive material prior to said removing to form channels and conductive lines.

* * * * *